United States Patent [19]
Liang et al.

[11] 4,439,468
[45] Mar. 27, 1984

[54] PLATINUM COATED SILVER POWDER

[75] Inventors: Anthony Liang, Belmont; Hsiao L. Cheng, Sunnyvale, both of Calif.

[73] Assignee: GTE Products Corporation, Stamford, Conn.

[21] Appl. No.: 412,366

[22] Filed: Aug. 25, 1982

Related U.S. Application Data

[62] Division of Ser. No. 257,073, Apr. 24, 1981.

[51] Int. Cl.³ .......................... C09D 5/24; C23C 3/02; B22F 1/02
[52] U.S. Cl. .................................. 427/216; 106/1.19; 106/1.21; 427/217; 427/437
[58] Field of Search ....................... 428/570, 669, 403; 419/35; 106/1.05, 1.15, 1.24, 1.28, 1.19, 1.21; 75/251, 0.5 A; 252/514; 200/265, 266; 427/216, 217, 437

[56] References Cited

U.S. PATENT DOCUMENTS

| | | | |
|---|---|---|---|
| 567,966 | 9/1896 | Drawbaugh | 428/570 |
| 2,312,097 | 2/1943 | Hull | 204/49 |
| 2,853,403 | 9/1958 | Mackiw et al. | 427/217 |
| 2,915,406 | 12/1959 | Rhoda et al. | 106/1.28 |
| 3,079,282 | 2/1963 | Haller | 427/96 |
| 3,390,981 | 7/1968 | Hoffman | 75/0.5 A |
| 3,419,419 | 12/1968 | Wright | 427/5 |
| 3,443,933 | 5/1969 | Boyhan et al. | 75/0.5 A |
| 3,486,928 | 12/1969 | Rhoda et al. | 106/1.24 |
| 3,531,301 | 9/1970 | Watson | 106/1.27 |
| 3,620,713 | 11/1971 | Short | 75/0.5 A |
| 3,620,714 | 11/1971 | Short | 75/0.5 A |
| 3,788,833 | 1/1974 | Short | 75/108 |

*Primary Examiner*—L. Dewayne Rutledge
*Assistant Examiner*—J. J. Zimmerman
*Attorney, Agent, or Firm*—Donald R. Castle

[57] ABSTRACT

A metallic powder having a core of silver and an outer layer of platinum wherein the silver is from about 90 to about 99.5% by weight of the total composition. A process for producing such a powder comprising forming a first aqueous slurry of silver powder, an appropriate amount of lignosulfonate ammonia and water, forming a second slurry of platinum as a platinum-ammonium complex dispersed in a water soluble alkanol, mixing the first and second slurry, adjusting the pH of the mixture to a range of from about 8 to about 10, adding an appropriate amount of hydrazine to the mixture maintaining the resultant slurry at about 40° C. to 60° C. for an appropriate time to coat the platinum onto the silver, then separating the platinum-coated silver powder from the remainder of the slurry.

2 Claims, No Drawings

4,439,468

PLATINUM COATED SILVER POWDER

CROSS REFERENCE TO RELATED APPLICATION

This application is a division of Ser. No. 257,073, filed Apr. 24, 1981 and assigned to the assignee of this application, Assignment recorded Apr. 24, 1981, Reel 3880, Frame 428.

This invention relates to powders used to form conductor pastes used in the semiconductor industry. More particularly it relates to platinum-coated silver powder useful in conductivity pastes.

BACKGROUND OF THE INVENTION

Heretofore conductor pastes have been made with gold, gold-platinum, silver, silver-palladium and combinations thereof. Because of rising costs of noble metals, there has recently been interest in reducing the amount of the more expensive noble metals and still retaining the desirable characteristics of the fired conductor; namely high conductivity, good solderability, low solder leach, and good initial and aged solder peel-strength.

OBJECTS AND SUMMARY OF THE INVENTION

It is an object of this invention to produce a composition comprising a silver core with platinum evenly coated on its surface.

It is an additional object of this invention to provide a method of producing a composition comprising silver core and platinum evenly coated on the surface thereof.

It is still another object of this invention to provide an economical way of producing platinum-coated silver powder.

These and other objects of the present invention are achieved by one aspect thereof which comprises forming an aqueous slurry comprising a relatively finely-divided silver powder and independently forming a slurry having a platinum-ammonia complex dispersed in a water soluble alkanol, mixing the two slurries and controlling the pH of the mixture adding sufficient hydrazine to achieve the platinum coating, and separating the platinum-coated silver powder.

DETAILED DESCRIPTION OF THE PREFERRED EMBODIMENTS

For a better understanding of the present invention, together with other and further objects, advantages and capabilities thereof, reference is made to the following disclosure and appended claims in connection with the above description of some of the aspects of the invention.

In order to make a silver-platinum paste cost competitive with the more common silver-palladium paste, the amount of platinum should be about 1.5% of the silver-platinum composite. While from about 0.5 to about 10% platinum can be used preferred results are achieved with about 1.5 to 2% by weight of platinum. Also, it was found that to achieve the desirable fired characteristics described above, the platinum must be deposited or coated uniformly onto the surface of the silver particles. Practitioners in this field will note that workable methods invariably introduce the platinum as a soluble salt which is reduced to the metallic state with a variety of reducing agents and under different temperature and acidity conditions. We have found, however, in order to have a silver-platinum powder which gives the desired electrical and mechanical properties, the platinum must be deposited evenly onto the silver surface. For this to occur, the silver powder must be well dispersed before the deposition process takes place.

The silver powder used should be of small particle size, preferably about 1 micron (Fisher sub-sieve) and have a surface area below about 1.3 $m^2/g$. The silver powder is passed through a 200 or 325 mesh screen before use, and thereafter dispersed in water containing a commercially available lignosulfonate. Other dispersants have not given successful results. The slurry should contain from about 20 to about 30% by weight of silver, from about 0.3 to about 0.3 to about 0.4% by weight of lignosulfonate and from about 0.7 to about 1.5% by weight of ammonia.

Platinum chloride is converted to the ammonia complex in accordance with standard methods, and dissolved in the silver slurry. In accordance with practice of the present invention, a platinum-ammonia complex is formed prior to the platinum-ammonia complex slurry is slurried in a water soluble alkanol such as methanol or ethanol. A concentration of from about 5% to about 7.5% by weight of platinum is used.

The slurry is adjusted to a pH of from about 8 to about 10, and sufficient hydrazine (generally a weight ratio of hydrazine to platinum of from about 7 to about 5 is used) added to deposit platinum metal onto the silver.

EXAMPLE

A solution of platinum chloride in methanol is made by dissolving about 15.75 parts of anhydrous platinum chloride, Pt $Cl_4$, in about 100 parts of methanol. The solution contains about 6.25 parts of platinum. To this solution about 15 parts of concentrated aqueous ammonia is added while stirring. A light yellow slurry results. The resulting slurry is warmed to about 50° C. for about 1 hour.

To about 900 parts of water, about 5 parts of lignosulfonate is added and stirred until the lignosulfonate is dissolved. About 10 parts of aqueous ammonia is added to the aqueous lignosulfonate solution.

Silver powder, of about 1 micron particle size and about 1.3 $m^2/g$ of surface area (B.E.T.) is sifted through a 200 mesh screen, and about 306 parts of the sifted powder is stirred into the above lignosulfonate solution. The resulting slurry is heated to about 50° C. and stirred for about 15 minutes to disperse the powder, and the platinum complex prepared above is then poured in. The mixture is kept stirred for additional 15 minutes at about 50° C. to dissolve the complex. The pH is controlled at about 8.

A solution containing about 25 parts of 35% hydrazine and about 25 parts of water is added into the stirred silver slurry during about 20 minutes. Temperature of reaction is kept at 50°-60° C. Gentle foaming occurs, but is suppressed by a small amount of octyl alcohol. After the hydrazine addition is completed, the slurry is kept stirred for another 20 minutes, then set aside for about 1 hour before the silver-platinum is filtered off and washed. The powder is then dried at about 70° C. for about 48 hours, then sifted through a 200 mesh screen.

Analysis of the powder shows it contains 2% Pt.

Incorporating this powder into a conductive paste by methods known to those skilled in the art results in a product which, when printed and fired in the conventional way, gives a conductivity of 5–10 milliohm per square and an aged peel strength of at least 4 pounds (48 hours at 150° C.). Solderability and solder leach resistance is comparable to the usual silver-palladium conductor.

By way of contrast, a powder made by blending platinum powder of 30 square meters per gram surface area with the same type of silver powder as above gave very poor peel strength and leach results. A second lot of silver-platinum powder was made as described in the Example, except water was used in place of methanol, and consequently no yellow slurry of the complex was formed. Pastes made with this powder gave variable results.

While there has been shown and described what are at present considered the preferred embodiments of the invention, it will be obvious to those skilled in the art that various changes and modifications may be made therein without departing from the scope of the invention as defined by the appended claims.

What is claimed:

1. A process for producing a platinum coated silver powder comprising
    (a) forming a first composition of a slurry comprising of from about 20 to about 30% by weight of a relatively finely divided silver powder relatively uniformly dispersed in said slurry, from about 0.3 to about 0.4% by weight of lignosulfonate and from about 0.7 to about 1.5% by weight of ammonia, balance water,
    (b) forming a second composition of a slurry comprising from about 5 to about 7.5% by weight of platinum as a platinum-ammonium complex as a solid, relatively uniformly dispersed in a water soluble alkanol,
    (c) mixing a sufficient ammount of said second compositions with said first composition to achieve a weight ratio of Ag to Pt from about 90:10 to about 95:5,
    (d) adjusting the pH of said mixture of from about 8 to about 10,
    (e) adding a sufficient amount of hydrazine to said mixture to achieve a weight ratio of hydrazine to platinum of from about 7 to 5,
    (f) maintaining the resultant slurry at a temperature of from about 40° C. to about 60° C. for a sufficient time to coat essentially all of said platinum onto said silver and
    (g) separating the platinum coated silver powder from the remainder of the slurry.

2. A process according to claim 1 wherein in forming said second composition platinum chloride and ammonia are added to form said platinum-ammonium complex.

* * * * *